US006787464B1

(12) United States Patent
Cheek et al.

(10) Patent No.: US 6,787,464 B1
(45) Date of Patent: Sep. 7, 2004

(54) METHOD OF FORMING SILICIDE LAYERS OVER A PLURALITY OF SEMICONDUCTOR DEVICES

(75) Inventors: Jon D. Cheek, Round Rock, TX (US); Scott D. Luning, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 10/189,048

(22) Filed: Jul. 2, 2002

(51) Int. Cl.[7] .............................................. H01L 21/44
(52) U.S. Cl. ..................... 438/683; 438/682; 438/685
(58) Field of Search ................................. 438/685, 683, 438/303, 720, 754, 682

(56) References Cited

U.S. PATENT DOCUMENTS 6,096,643 A * 8/2000 Nariman et al. ............ 438/666
6,355,553 B1 * 3/2002 Shinohara ................... 438/626

* cited by examiner

Primary Examiner—Van Thu Nguyen
Assistant Examiner—Brad Smith

(74) Attorney, Agent, or Firm—Williams, Morgan & Amerson, P.C.

(57) ABSTRACT

The present invention is generally directed to various methods of forming metal silicide regions on transistors based upon gate critical dimensions. In one illustrative embodiment, the method comprises forming a layer of refractory metal above a plurality of transistors, reducing a thickness of at least a portion of the layer of refractory metal above at least some of the transistors and performing at least one anneal process to form metal silicide regions above the transistors. In another illustrative embodiment, the method comprises forming a layer of refractory metal above the plurality of transistors, reducing the thickness of the layer of refractory metal above a first of the transistors having a gate electrode with a critical dimension that is less than a critical dimension of a gate electrode structure of another of the plurality of transistors, and performing at least one anneal process to form metal silicide regions on the plurality of transistors. In yet another illustrative embodiment, the method comprises forming a layer of refractory metal to an original thickness above a plurality of transistors, reducing the original thickness of a portion of the layer of refractory metal above at least some of the transistors to define a layer of refractory metal having multiple thicknesses, and performing at least one anneal process to convert portions of the layer of refractory metal having multiple thicknesses to metal silicide regions on the transistors.

13 Claims, 6 Drawing Sheets

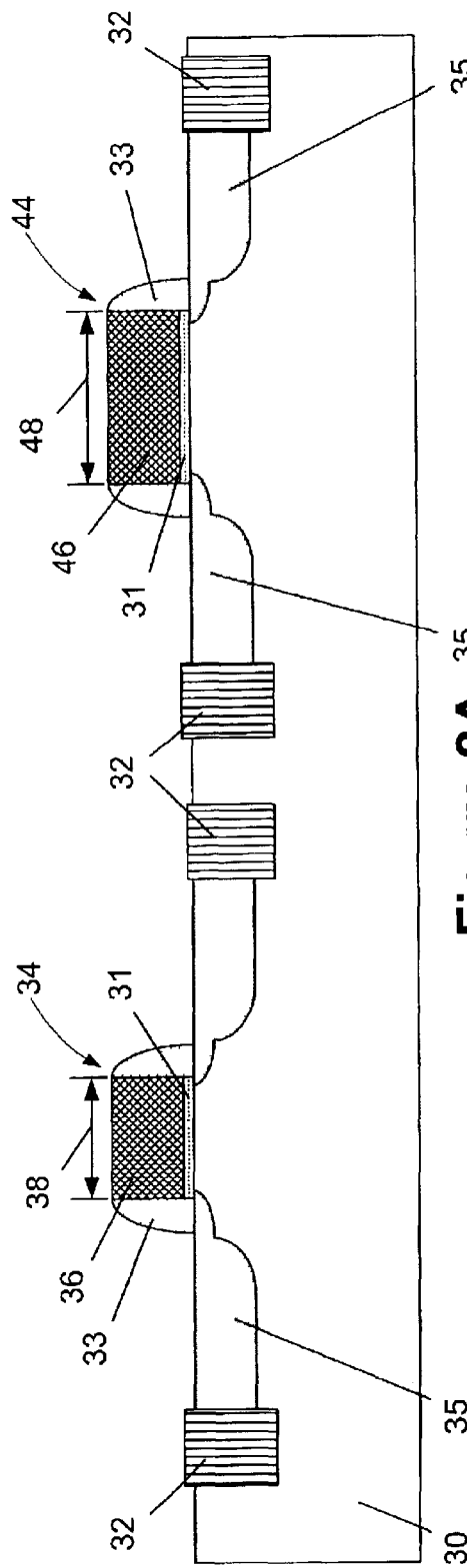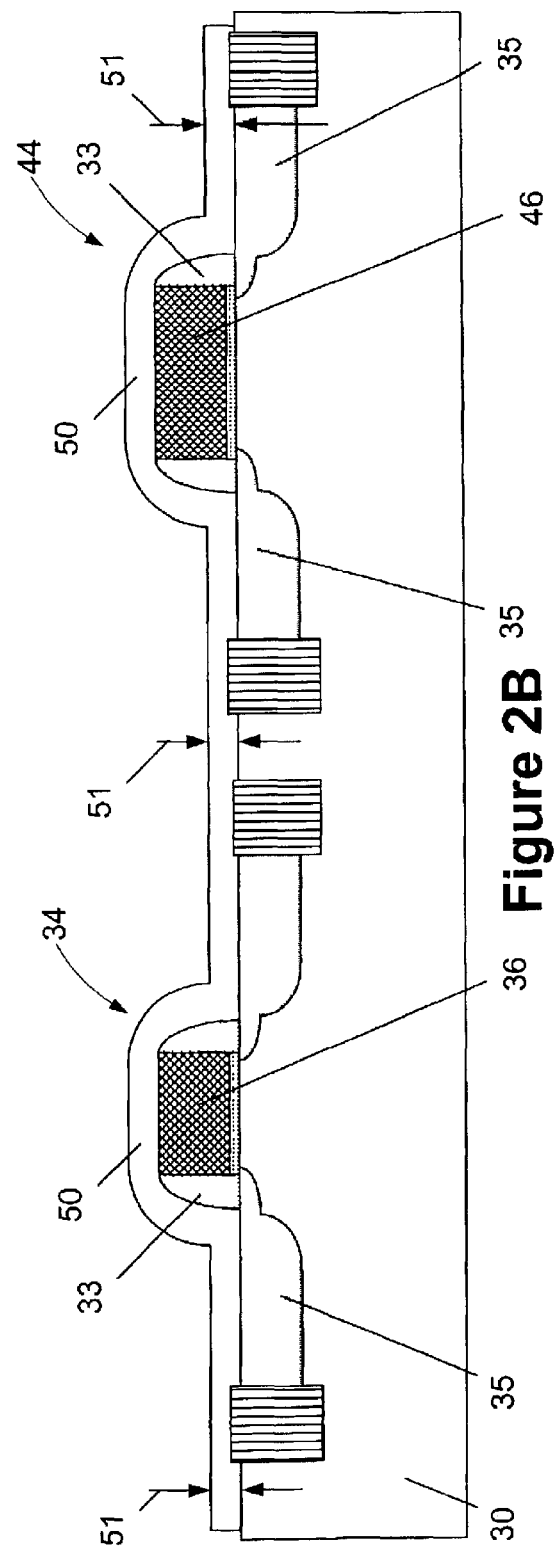

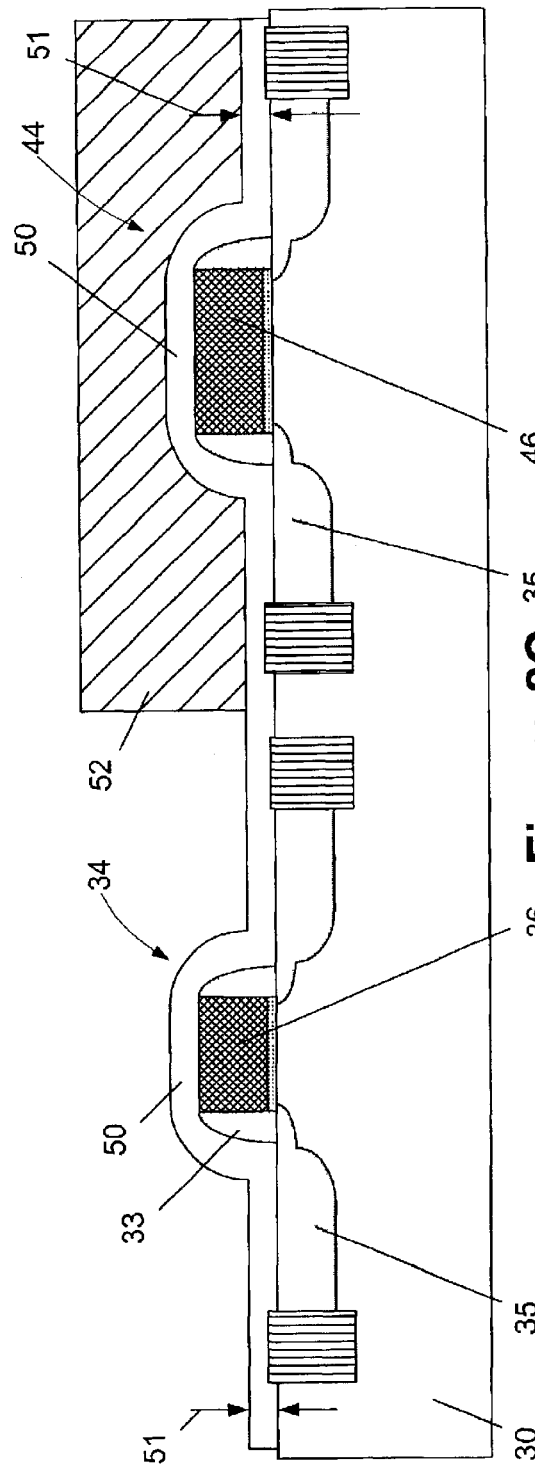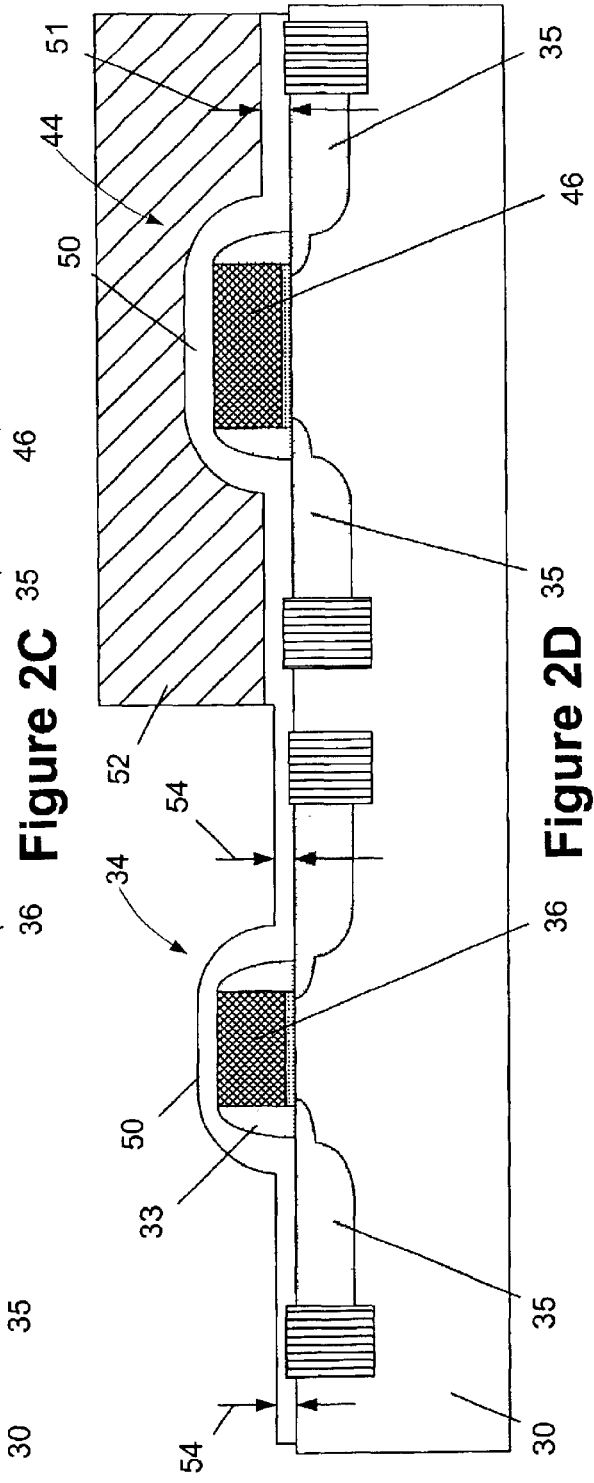

METHOD OF FORMING SILICIDE LAYERS OVER A PLURALITY OF SEMICONDUCTOR DEVICES

BACKGROUND OF THE INVENTION

1. Field of the Invention

This invention relates generally to semiconductor fabrication technology, and, more particularly, to methods of forming silicide regions on transistors based upon gate critical dimensions.

2. Description of the Related Art

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate insulation thickness, and the like, are reduced. For example, all other things being equal, the smaller the channel length of the transistor, the faster the transistor will operate. Thus, there is a constant drive to reduce the size, or scale, of the components of a typical transistor to increase the overall speed of the transistor, as well as integrated circuit devices incorporating such transistors.

FIG. 1 depicts an example of an illustrative transistor 10 fabricated on an illustrative substrate 11 comprised of, for example, silicon. The transistor 10 is comprised of a gate insulation layer 14, a gate electrode 16, sidewall spacers 19, and source/drain regions 18. The gate electrode 16 has a critical dimension 16A that approximately corresponds to the gate length of the transistor 10. A plurality of trench isolation regions 17 are formed in the substrate 11 to electrically isolate the transistor 10 from other transistors (not shown) or structures. Also depicted in FIG. 1 are a plurality of conductive contacts 20 formed in a layer of insulating material 21. The conductive contacts 20 provide electrical connection to the source/drain regions 18. As constructed, the transistor 10 defines a channel region 12 in the substrate 11 beneath the gate insulating layer 14. The transistor 10 further comprises a plurality of metal silicide regions 13 formed above the gate electrode 16 and source/drain regions 18.

The metal silicide regions 13 may be formed by depositing a layer of refractory metal (not shown), e.g., nickel, cobalt, titanium, platinum, erbium, tantalum, etc., above the source/drain regions 18, the sidewall spacers 19 and the gate electrode 16. Thereafter, a two-step heating process may be performed to convert the portions of the layer of refractory metal in contact with the gate electrode 16 and the source/drain regions 18 into a metal silicide, e.g., nickel silicide, cobalt silicide, etc. Such silicide regions 13 are formed for a variety of purposes, e.g., to reduce the contact resistance for the source/drain regions 18 and gate electrode 16. The metal silicide regions 13 may, at least in some cases, assist in increasing device performance in that they tend to reduce various resistances encountered in operating the transistor 10.

During the process of forming such metal silicide regions 13, a volumetric amount of the polysilicon gate electrode 16 is consumed. The volumetric amount of the gate electrode 16 consumed depends, at least in part, on the thickness of the layer of refractory metal deposited on the partially completed transistor and on the critical dimension 16A of the gate electrode 16.

To combat this problem, the thickness of the layer of refractory metal is controlled based upon the smallest critical dimension 16A of the gate electrode structures 16 for one or more of the transistors 10 formed above the substrate 11. However, using such processing techniques leads to other problems. For example, depositing the layer of refractory metal to the very small thickness determined based upon the smallest critical dimension 16A may be very difficult to accomplish due to the thinness of the layer of refractory metal. Additionally, forming the metal silicide regions 13 using this technique will cause all of the metal silicide regions 13 formed on a wafer to be formed to a thickness that is less than desirable for at least some of the transistors 10 formed on the substrate. That is, all other things being equal, it may be desirable that the metal silicide regions 13 on the gate electrode 16 of at least some transistors 10 be thicker than that dictated by the smallest gate critical dimensions 16A on the substrate. As a result, the electrical characteristics of some of the transistors 10, and products incorporating such transistors, may be adversely impacted due to the use of excessively thin metal silicide regions 13 on all of the transistors 10 formed above a substrate 11.

The present invention is directed to a device and various methods that may solve, or at least reduce, some or all of the aforementioned problems.

SUMMARY OF THE INVENTION

The present invention is generally directed to various methods of forming metal silicide regions on transistors based upon gate critical dimensions. In one illustrative embodiment, the method comprises forming a layer of refractory metal above a plurality of transistors, reducing a thickness of a portion of the layer of refractory metal above at least some of the transistors and performing at least one anneal process to form metal silicide regions above the transistors. In another illustrative embodiment, the method comprises forming a layer of refractory metal above the plurality of transistors, reducing the thickness of the layer of refractory metal above at least a first of the transistors having a gate electrode with a critical dimension that is less than a critical dimension of a gate electrode structure of another of the plurality of transistors, and performing at least one anneal process to form metal silicide regions on the plurality of transistors. In yet another illustrative embodiment, the method comprises forming a layer of refractory metal to an original thickness above a plurality of transistors, reducing the original thickness of a portion of the layer of refractory metal above at least some of the transistors to define a layer of refractory metal having multiple thicknesses, and performing at least one anneal process to convert portions of the layer of refractory metal having multiple thicknesses to metal silicide regions on the transistors.

In a further illustrative embodiment, the method comprises forming a plurality of transistors above a semiconducting substrate, a first of the transistors having a gate electrode with a critical dimension that is less than a critical dimension of a gate electrode structure of another of the plurality of transistors, forming a layer of refractory metal above the plurality of transistors, forming a patterned masking layer above the layer of refractory metal, the patterned masking layer exposing at least a portion of the layer of refractory metal formed above the first transistor, performing an etching process on the exposed portion of the layer of refractory metal to reduce the original thickness of the exposed portion of the layer of refractory metal to a second thickness, and performing at least one anneal process on the layer of refractory metal after the etching process is performed to form metal silicide regions on the plurality of transistors. In yet a further illustrative embodiment, the method comprises forming a plurality of transistors above a semiconducting substrate, identifying a first group of the transistors with gate electrodes of a critical dimension that is less than a critical dimension of gate electrodes of a second group of transistors of the plurality of transistors, identifying at least one region of the substrate wherein the first group of transistors are located, forming a layer of refractory metal above the plurality of transistors, performing an etching process to reduce a thickness of the layer of refractory metal in the identified at least one region of the substrate to define a layer of refractory metal having multiple thicknesses, and performing at least one anneal process to convert at least a portion of the layer of refractory metal having multiple thicknesses to metal silicide regions on the transistors.

BRIEF DESCRIPTION OF THE DRAWINGS

The invention may be understood by reference to the following description taken in conjunction with the accompanying drawings, in which like reference numerals identify like elements, and in which:

FIGS. 2A–2E depict one illustrative process flow of one illustrative embodiment of the present invention;

Figure 1:
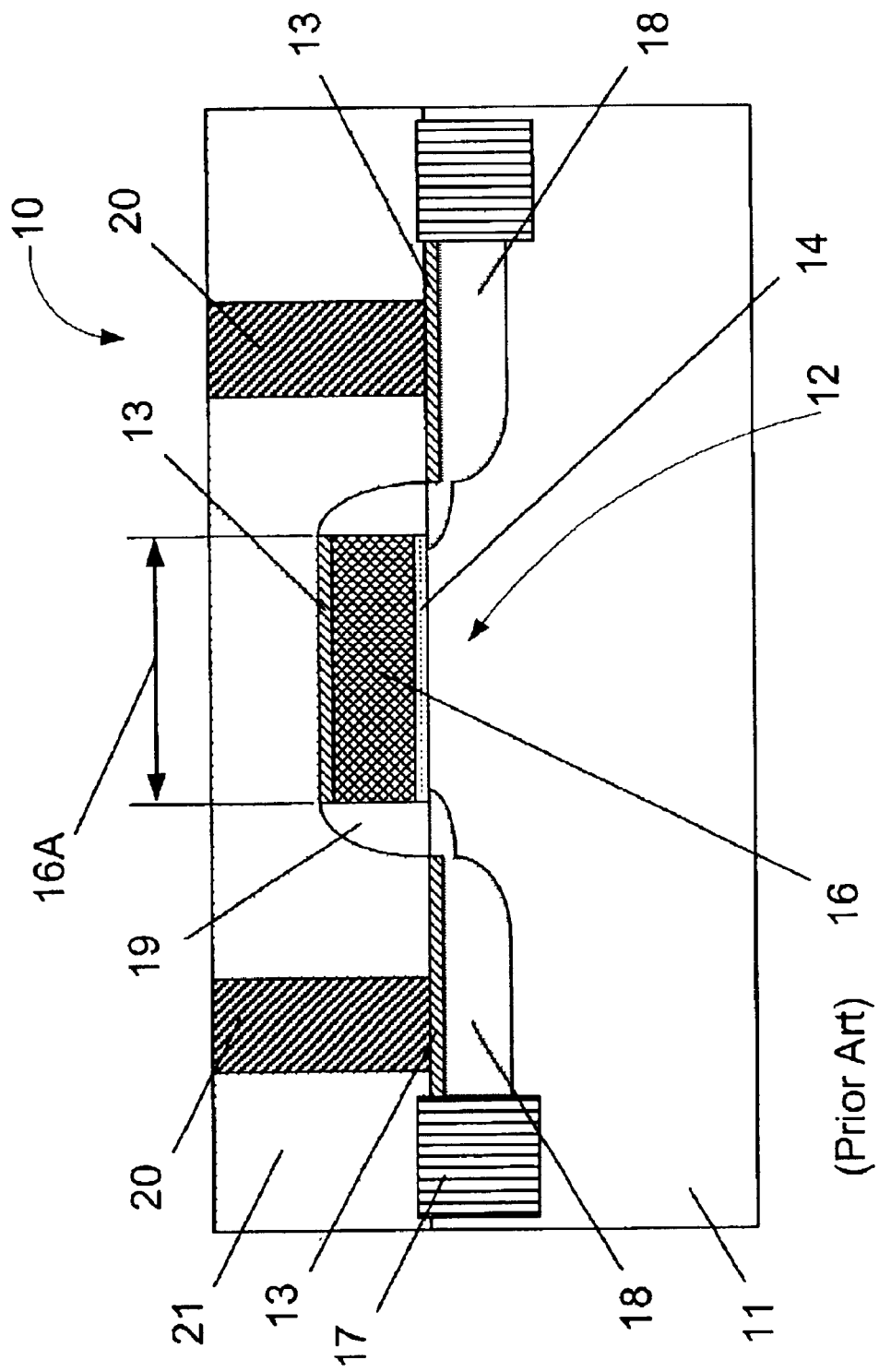
FIG. 1 is a cross-sectional view of an illustrative prior art transistor.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In general, the present invention is directed to various methods of forming metal silicide regions on transistors based upon gate critical dimensions. Although the present invention will be initially disclosed in the context of the formation of metal silicide regions above an illustrative NMOS transistor, those skilled in the art will understand after a complete reading of the present application that the present invention is not so limited. More particularly, the present invention may be employed to form metal silicide regions on devices of differing technologies, e.g., NMOS, PMOS, CMOS, etc., and it may be employed with a variety of different type devices, e.g., memory devices, microprocessors, logic devices, etc.

Figure 2E:
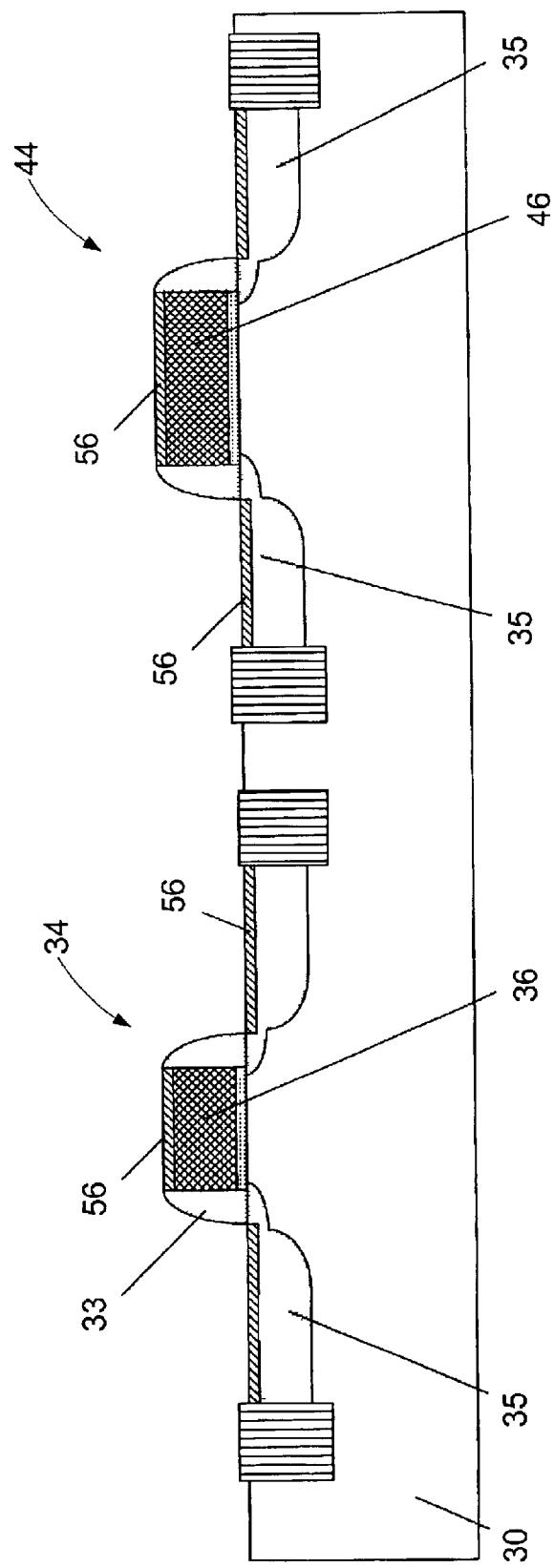

The present invention will now be described with reference to one illustrative embodiment, as depicted in FIGS. 2A–2E. As shown in FIG. 2A, representative transistors 34, 44 are formed above a wafer or substrate 30 having isolation regions 32 formed therein. The transistors 34, 44 are comprised of a variety of components commonly formed on transistors, e.g., gate insulation layers 31, sidewall spacers 33, source/drain regions 35, etc. The transistors 34, 44 may be formed by a variety of known techniques using a variety of known materials.

The transistor 34 is comprised of a gate electrode 36 having a critical dimension 38 that is less than a critical dimension 48 of the gate electrode 46 of the transistor 44. For purposes of clarity and explanation, relative sizes of the gate electrode 36, 46 are somewhat exaggerated. The variations in the critical dimensions 38, 48 may be due to a variety of factors, e.g., variations in the critical dimension of features formed in a patterned layer of photoresist that is used as a masking layer during one or more etching processes used to form the gate electrodes 36, 46. Variations in etching processes used to define the gate electrodes 36, 46 may also cause variations in gate critical dimensions. Additionally, such critical dimension variations may be due to the location of the transistor on the wafer. For example, for a variety of reasons, some of which may be unknown, transistors formed on certain regions of the wafer 30 may have gate critical dimensions that are different from the critical dimensions of other gate electrode structures formed on other areas of the wafer. This aspect will be discussed in greater detail later in the application. It should also be understood that the depiction of single transistors 34, 44 in the attached figures is by way of example only. That is, the transistors 34, 44 may be representative of one or more transistors, or groups of transistors, wherein there are variations in the critical dimensions of the gate electrode structures. The magnitude of variations may be different depending upon the product under construction. For example, for a product wherein the target critical dimension of the gate electrode structures is 180 nm, the critical dimension of the gate electrode structures may vary between approximately 65–95 nm.

Next, as depicted in FIG. 2B, a layer of refractory metal 50 is formed above the substrate 30 and the transistors 34, 44. The layer of refractory metal 50 may be comprised of a variety of materials, e.g., nickel, cobalt, titanium, platinum, erbium, tantalum, etc., and it may be formed by a variety of techniques, e.g., physical vapor deposition ("PVD"), chemical vapor deposition ("CVD"), etc. The thickness 51 of the layer of refractory metal 50, as deposited, may be determined based upon a variety of factors. In one embodiment, the thickness 51 of the layer of refractory metal 50, as deposited, may be determined based upon the critical dimension 48 of the transistor 44 having the larger critical dimension. Using this technique, the thickness 51 of the layer of refractory metal 50 may be customized to maximize the volume occupied by the metal silicide regions to be formed above the transistors with the larger critical dimensions. Alternatively, the layer of refractory metal 50 may be formed to a thickness that may be readily formed by the process tool, e.g., a PVD tool, that is used to form the layer of refractory metal 50, as long as this thickness exceeds the thickness needed to form the metal silicide regions on the transistors with the larger critical dimensions. In one illustrative embodiment, when the target critical dimension for gate electrode structures is 80 nm, the layer of refractory metal 50 may be comprised of nickel, and it may have a thickness 51 of approximately 7–15 nm.

Thereafter, as indicated in FIG. 2C, a masking layer 52 is formed above the transistor 44 having the larger critical dimension 48. As mentioned previously, the transistors 34, 44 are intended to be representative in nature. Thus, the masking layer 52 may be formed over one or more transistors 46 having what are determined or deemed to have gate electrodes with larger critical dimensions. The masking layer 52 may be comprised of a photoresist material (positive or negative) and it may be formed using known photolithographic tools and methods.

Thereafter, as indicated in FIG. 2D, an etching process is performed on the exposed portions of the layer of refractory metal 50 to reduce the thickness of the exposed portions of the layer of refractory metal 50 formed above transistors 34 having gate electrode 36 with smaller critical dimensions 38. This etching process may be an anisotropic plasma etching process or by a wet etching process using SPM, a known chemical composition, or other similar etching processes. The duration of the etching process will vary depending upon the desired amount of the thickness 51 of the original layer of refractory metal 50 to be removed. This etching process results in portions of the layer of refractory metal 50 having a reduced thickness 54. The magnitude of this reduced thickness 54 may vary depending upon the critical dimension 38 of the transistor 34. In one illustrative embodiment, when the layer of refractory metal 50 had an original thickness 51 of approximately 10–15 nm, the etching process may be performed such that the reduced thickness 54 of the layer of refractory metal 50 is approximately 5–10 nm in the areas where the transistors with smaller gate critical dimensions are located. Stated another way, approximately 40–60% of the layer of refractory metal 50 may be removed by the etching process.

After the etching process is performed to thin certain areas of the layer of refractory metal 50, traditional silicide processing operations may be performed to form metal silicide regions 56 above the gate electrodes 36, 46 and the source/drain regions 35, as depicted in FIG. 2E. For example, a first anneal process may be performed at a temperature of approximately 450–500° C., unreacted portions of the layer of refractory metal 50 may be removed, and a second anneal process may be performed at a temperature of approximately 700–800° C. to form stable metal silicide regions 56 above the gate electrodes 34, 46 and the source/drain regions 35 of the transistors 34, 44.

The critical dimensions 38, 48 of the transistors 34, 44 may be measured using a variety of metrology tools, such as a scanning electron microscope (SEM), a scatterometry tool, etc. Moreover, the critical dimensions of a plurality of gate electrode structures may be measured and averaged or statistically manipulated to arrive at a nominal critical dimension for all of the sampled gate electrode structures.

Figure 3:
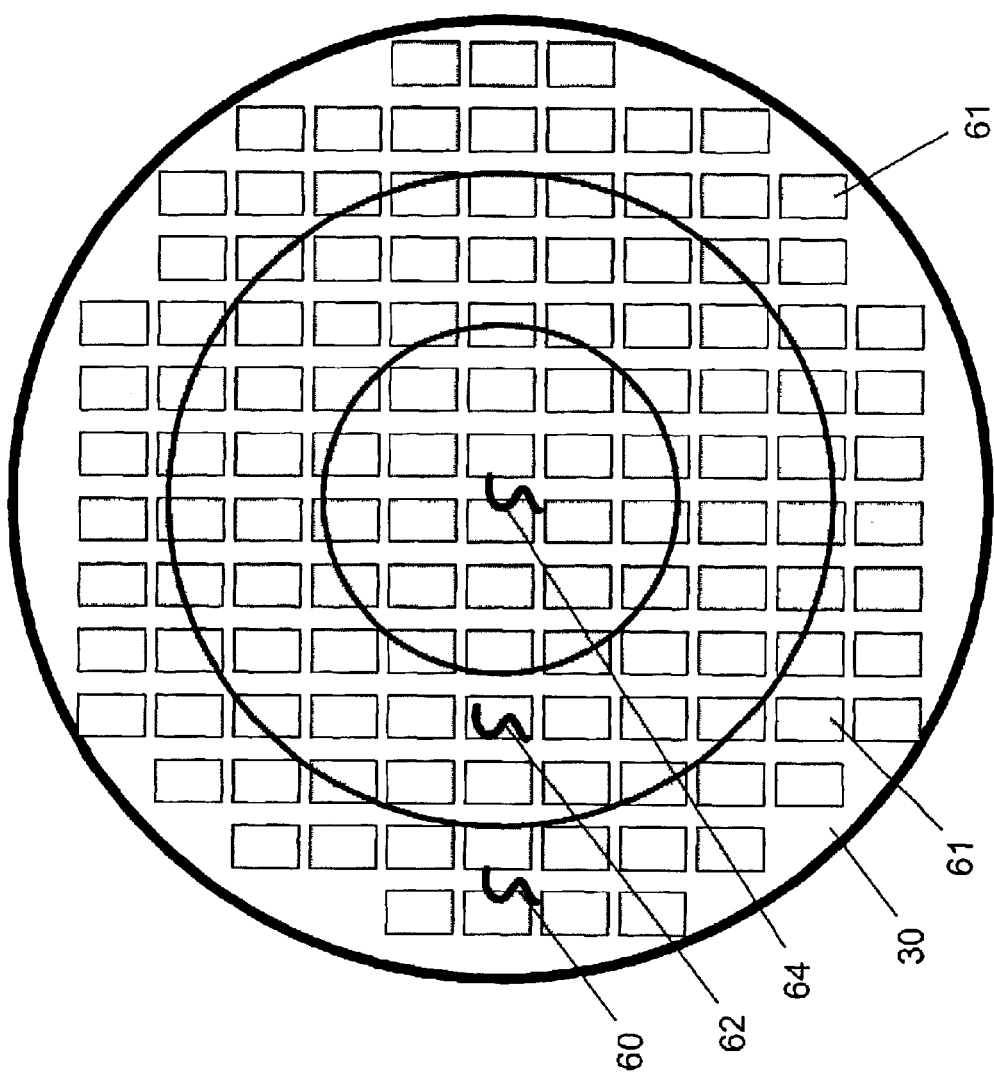
FIG. 3 is a plan view of an illustrative wafer having a plurality of die formed thereon.

FIG. 3 is a depiction of a wafer 30 having a plurality of die 61 formed thereabove. The number and size of die 61 on a given wafer 30 may vary depending upon the type of devices under construction. Millions or thousands of gate electrode structures may be formed on each die 61. As stated previously, it may be the case that, due to a variety of factors, the critical dimension of gate electrode structures formed above the wafer 30 may vary depending upon the location on the wafer 30 where the transistors are formed. For example, the critical dimension of a plurality of gate electrode structures that are formed in different regions across the surface of the wafer 30 may be measured. Based upon an analysis of this metrology data, it may be observed that the gate electrode structures formed in an outer region 60 of the wafer 30 tend to have smaller gate critical dimensions as compared to the critical dimensions of the gate electrode structures formed in an inner region 64 of the wafer 30, as depicted in FIG. 3. The gate electrode structures formed in the middle region 62 may have critical dimensions that fall within those found in the outer region 60 and inner region 64 of the wafer 30. However, it should be understood that the present invention is not limited to situations where across-wafer variations of critical dimensions are identified. Moreover, the various regions of the wafer 30 depicted in FIG. 3 are provided by way of example only. That is, depending upon the metrology data, only two regions may be identified, i.e., an inner region and an outer region. Additionally, the various regions of the wafer 30 need not be concentric in nature as depicted in FIG. 3. In one embodiment, once the regions are identified wherein the critical dimensions of the gate electrode structures are of a reduced size, the present invention may be employed to reduce the thickness of the layer of refractory metal 50 in those identified areas.

Figure 4:
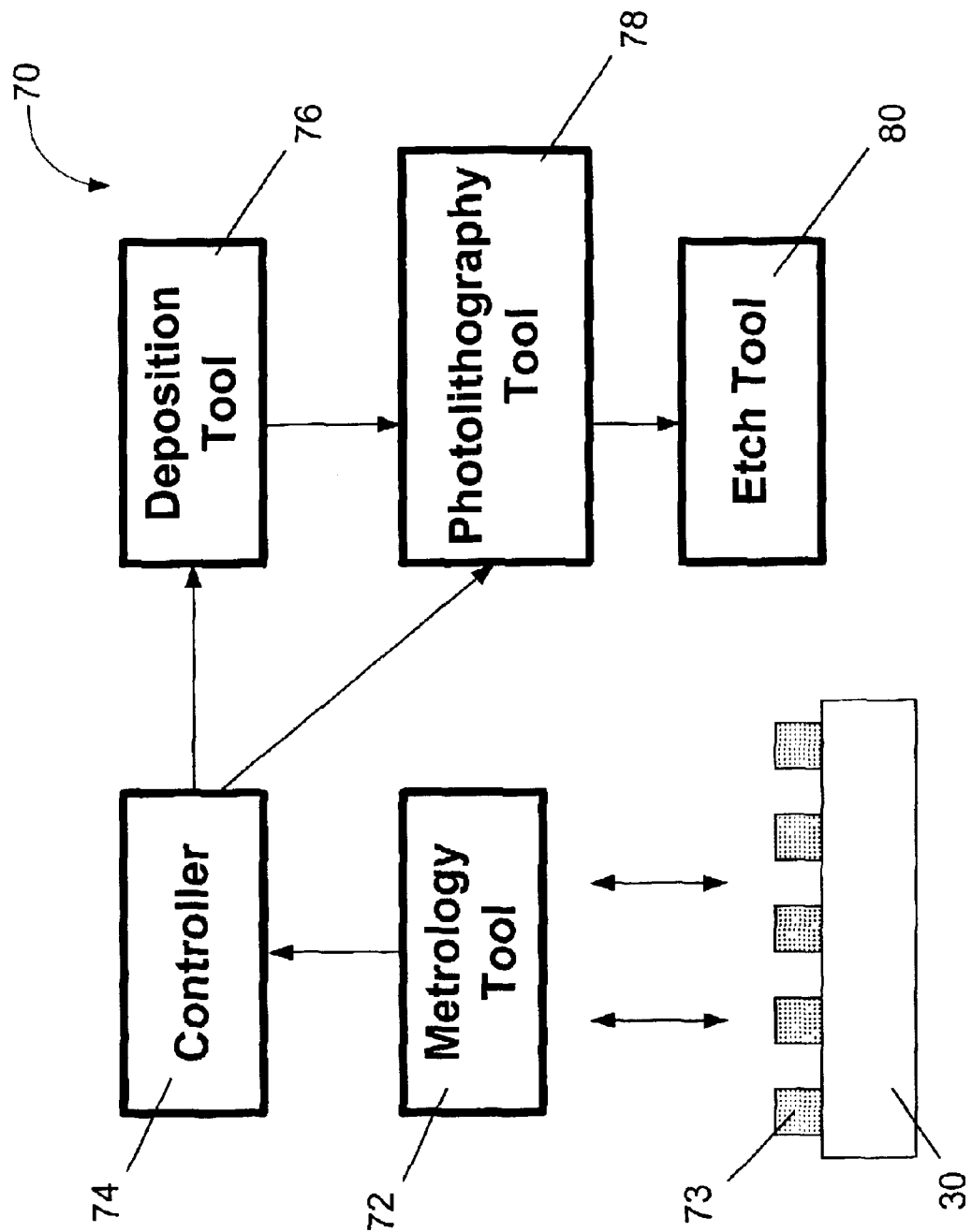
FIG. 4 is a schematic depiction of an illustrative system that may be employed with the present invention.

FIG. 4 depicts one embodiment of an illustrative system 70 that may be employed with the present invention. As shown therein, the system 70 is comprised of a metrology tool 72, a controller 74, a deposition tool 76, a photolithography tool 78 and an etch tool 80. Also depicted in FIG. 4 is an illustrative wafer 30 comprised of a plurality of gate electrode structures 73 formed thereabove.

The metrology tool 72 may be any type of tool useful in obtaining data relating to the critical dimensions of one or more of the plurality of gate electrode structures 73 formed above the wafer 30. For example, the metrology tool 72 may be a scanning electron microscope, a scatterometry tool, etc. Moreover, it should be understood that the metrology tool 72 may be used to measure only a representative number of gate electrode structures 73 formed above the wafer 30. It should also be understood that the metrology data obtained by the metrology tool 72 may not be obtained for every wafer within a lot, i.e., a representative number of wafers 30 within a lot may be measured by the metrology tool 72. Lastly, not every lot of wafers needs to be measured to practice the present invention. That is, a sampling pattern may be established wherein certain lots are subjected to metrology activities described above, i.e., every third lot of wafers may be subjected to such metrology testing.

After the metrology data is collected by the metrology tool 72, it is provided to the controller 74. Based upon this data, the controller 74 may then identify variations in the critical dimensions of the gate electrode structures 73. In one embodiment, the controller 74 may identify regions or areas of the wafer 30 wherein gate electrode structures having similar critical dimensions are located, e.g., regions where gate electrode structures with relatively small critical dimensions are located, e.g., the outer region 60 of the wafer 30 depicted in FIG. 3.

After the critical dimension measurement data is obtained, various other traditional processing operations may be performed to complete the formation of the transistors above the wafer 30. For example, other process operations may be performed to form sidewall spacers and source/drain regions for the transistors.

When it is time to form a layer of refractory metal 50 above the wafer 30 as part of the salicidation process, the controller 74 may, in one embodiment, determine the thickness of the layer of refractory metal 50 to be formed above the transistors, and it may provide this determined thickness to the deposition tool 76, e.g., a PVD or CVD tool, wherein the layer of refractory metal 50 may be formed. In this embodiment, the thickness of the layer of refractory metal 50 is determined based upon the critical dimension data obtained by the metrology tool 72. The deposition tool 76 is then used to form the layer of refractory metal 50 to the determined thickness. In an alternative embodiment (not depicted in FIG. 4), the controller 74 may not communicate with the deposition tool 76. In that embodiment, the deposition tool 76 may be used to form the layer of refractory metal 50 to a predetermined thickness that is deemed to be adequate for performing the salicidation process on the transistors with gate electrodes having relatively large critical dimensions.

Thereafter, based upon the identification of the gate electrode structures with relatively small critical dimensions, the controller 74 may identify the portion of the wafer 30 to be masked by a photoresist masking layer 52 to be formed in the photolithography tool 78. Based upon experience, a variety of reticles may be manufactured which provide for formation of a layer of photoresist above certain desired regions of the wafer 30. For example, individual reticles may be provided that may be used to form a photoresist masking layer 52 above one or more of the inner region 64, the middle region 62 and the outer region 60 of the wafer 30 depicted in FIG. 3. Based upon the gate critical dimension metrology data obtained by the metrology tool 72, the controller 74 may determine that the gate electrode structures formed in a certain region of the wafer 30 can tolerate the salicidation process using the as-deposited thickness 51 of the layer of refractory metal 50. In that situation, a photoresist masking layer 52 may be formed above those identified regions prior to performing the etching process to reduce the thickness of the exposed portions of the layer of refractory metal 50. As a more specific example, assuming that the controller 74 identifies that gate electrode structures lying outside of the inner region 64 of the wafer 30 depicted in FIG. 3 have gate electrode structures with critical dimensions of a reduced size such that performing salicidation processes using the as-deposited thickness 51 of the layer of refractory metal 50 may produce undesirable results, the controller 74 may direct that the photolithography tool 78 be used to form a masking layer 52 above the layer of refractory metal 50 in only the inner region 64 of the wafer 30.

Once the masking layer 52 is formed above selected areas or regions of the wafer 30, the etch tool 80 performs an etching process to reduce the thickness of the exposed portions of the layer of refractory metal 50. The etching process performed in the etch tool 80 may be an anisotropic etching process, and it may be a controlled etching process that exhibits relatively slow etching rates such that better control may be achieved in arriving at the final reduced thickness 54 of the layer of refractory metal 50. That is, by knowing the starting, as-deposited thickness 51 of the layer of refractory metal 50, and the etch rate of the etching process performed in the etch tool 80, the reduction in thickness of the layer of refractory metal 50 may be controlled.

The actions taken by the controller 74 may be accomplished with hardware or software or a combination of both. In the illustrated embodiments, the controller 74 is a collection of logic circuitry that is capable of processing the appropriate software to implement the functions described herein. For example, the controller 74 may be a computer that directs the overall operations of the semiconductor manufacturing facility, or it may be a lower level computer. Moreover, the controller 74 may be a stand-alone computer, or it may be a computer that is resident on the metrology tool 72 or the photolithography tool 78.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be understood, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the actions and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

The present invention is generally directed to various methods of forming metal silicide regions on transistors based upon gate critical dimensions. In one illustrative embodiment, the method comprises forming a layer of refractory metal 50 above a plurality of transistors, reducing a thickness of a portion of the layer of refractory metal 50 above at least some of the transistors and performing at least one anneal process to form metal silicide regions on the transistors. In another illustrative embodiment, the method comprises forming a layer of refractory metal above the plurality of transistors, reducing a thickness of the layer of refractory metal above at least a first of the transistors which has a gate electrode with a critical dimension that is less than a critical dimension of a gate electrode structure of another of the plurality of transistors, and performing at least one anneal process to form metal silicide regions on the plurality of transistors. In yet another illustrative embodiment, the method comprises reducing the original thickness of a portion of the layer of refractory metal above at least some of the transistors to define a layer of refractory metal having multiple thicknesses, and performing at least one anneal process to convert portions of the layer of refractory metal having multiple thicknesses to metal silicide regions on the transistors.

In a further illustrative embodiment, the method comprises forming a plurality of transistors above a semiconducting substrate, a first of the transistors having a gate electrode with a critical dimension that is less than a critical dimension of a gate electrode structure of another of the plurality of transistors, forming a layer of refractory metal above the plurality of transistors, forming a patterned masking layer above the layer of refractory metal, the patterned masking layer exposing at least a portion of the layer of refractory metal formed above the first transistor, performing an etching process on the exposed portion of the layer of refractory metal to reduce the original thickness of the exposed portion of the layer of refractory metal to a second thickness, and performing at least one anneal process on the layer of refractory metal after the etching process is performed to form metal silicide regions on the plurality of transistors. In yet a further illustrative embodiment, the method comprises forming a plurality of transistors above a semiconducting substrate, identifying a first group of the plurality of transistors with gate electrodes of a critical dimension that is less than a critical dimension of gate electrodes of a second group of transistors of the plurality of transistors, identifying at least one region of the substrate wherein the first group of transistors are located, forming a layer of refractory metal above the plurality of transistors, performing an etching process to reduce a thickness of the layer of refractory metal in the identified region of the substrate to define a layer of refractory metal having multiple thicknesses, and performing at least one anneal process to convert at least a portion of the layer of refractory metal having multiple thicknesses to metal silicide regions on the transistors.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:

forming a layer of refractory metal having an original thickness above a plurality of transistors;

performing an etching process on a portion of said layer of refractory metal above at least some of said transistors to remove approximately 40–60% of said original thickness of said layer of refractory metal; and performing at least one anneal process to form metal silicide regions on said transistors.

2. The method of claim 1, wherein forming a layer of refractory metal having an original thickness above a plurality of transistors comprises depositing a layer of refractory metal having an original thickness above a plurality of transistors.

3. The method of claim 1, wherein forming a layer of refractory metal having an original thickness above a plurality of transistors comprises forming a layer of refractory metal having an original thickness above a plurality of transistors, said layer of refractory metal comprised of at least one of nickel, cobalt, titanium, platinum, erbium and tantalum.

4. The method of claim 1, wherein performing at least one anneal process to form metal silicide regions on said transistors comprises performing a first anneal process at a temperature ranging from approximately 450–500° C. and performing a second anneal process at a temperature ranging from approximately 700–800° C.

5. A method, comprising:

forming a layer of refractory metal to an original thickness above a plurality of transistors;

reducing said original thickness of a portion of said layer of refractory metal above at least some of said transistors to define a layer of refractory metal having multiple thicknesses; and performing at least one anneal process to convert portions of said layer of refractory metal having multiple thickness to metal silicide regions on said transistors.

6. The method of claim 5, wherein forming a layer of refractory metal to an original thickness above a plurality of transistors comprises depositing a layer of refractory metal to an original thickness above a plurality of transistors.

7. The method of claim 5, wherein forming a layer of refractory metal to an original thickness above a plurality of transistors comprises forming a layer of refractory metal to an original thickness above a plurality of transistors, said layer of refractory metal comprised of at least one of nickel, cobalt, titanium, platinum, erbium and tantalum.

8. The method of claim 5, wherein reducing said original thickness of a portion of said layer of refractory metal above at least some of said transistors to define a layer of refractory metal having multiple thicknesses comprises performing at least one etching process to reduce said original thickness of a portion of said layer of refractory metal above at least some of said transistors to define a layer of refractory metal having multiple thicknesses.

9. The method of claim 5, wherein performing at least one anneal process to form metal silicide regions on said transistors comprises performing a first anneal process at a temperature ranging from approximately 450–500° C. and performing a second anneal process at a temperature ranging from approximately 700–800° C.

10. A method, comprising:

forming a layer of refractory metal in an original thickness above a plurality of transistors;

performing an etching process on a portion of said layer of refractory metal above at least some of said transistors to remove approximately 40–60% of said original thickness of said layer of refractory metal to thereby define a layer of refractory metal having multiple thicknesses; and performing at least one anneal process to convert portions of said layer or refractory metal having multiple thickness to metal silicide regions on said transistors.

11. The method of claim 10, wherein forming a layer of refractory metal to an original thickness above a plurality of transistors comprises depositing a layer of refractory metal to an original thickness above a plurality of transistors.

12. The method of claim 10, wherein forming a layer of refractory metal to an original thickness above a plurality of transistors comprises forming a layer of refractory metal to an original thickness above a plurality of transistors, said layer of refractory metal comprised of at least one of nickel, cobalt, titanium, platinum, erbium and tantalum.

13. The method of claim 10, wherein performing at least one anneal process to form metal silicide regions on said transistors comprises performing a first anneal process at a temperature ranging from approximately 450–500° C. and performing a second anneal process at a temperature ranging from approximately 700–800° C.

* * * * *

UNITED STATES PATENT AND TRADEMARK OFFICE
CERTIFICATE OF CORRECTION

PATENT NO. : 6,787,464 B1
DATED : September 7, 2004
INVENTOR(S) : Jon D. Cheek and Scott D. Luning It is certified that error appears in the above-identified patent and that said Letters Patent is hereby corrected as shown below:

Column 10,
Lines 33-34, "thickness" should be -- thicknesses --.
Line 60, "in" should be -- to --.

Column 11,
Line 2, "or" should be -- of --.
Lines 2-3, "thickness" should be -- thicknesses --.

Signed and Sealed this

Twenty-first Day of December, 2004

JON W. DUDAS
*Director of the United States Patent and Trademark Office*